United States Patent

Olson

[11] Patent Number: 5,923,098
[45] Date of Patent: Jul. 13, 1999

[54] DRIVER BOARD HAVING STORED CALIBRATION DATA

[75] Inventor: Donald R. Olson, Shoreview, Minn.

[73] Assignee: Micro Control Company, Minneapolis, Minn.

[21] Appl. No.: 08/943,566

[22] Filed: Oct. 3, 1997

[51] Int. Cl.⁶ .................................................. G01R 31/28
[52] U.S. Cl. ............................ 307/40; 371/22.1; 371/27; 324/500; 324/537
[58] Field of Search .............................. 307/40; 371/22.1, 371/27; 324/73.1, 500, 537

[56] References Cited

U.S. PATENT DOCUMENTS

| | | | |
|---|---|---|---|
| 4,637,020 | 1/1987 | Schinabeck | 371/22.1 |
| 4,764,925 | 8/1988 | Grimes et al. | 324/73.1 |
| 4,862,067 | 8/1989 | Brune et al. | 324/73.1 |
| 4,900,948 | 2/1990 | Hamilton . | |
| 4,928,278 | 5/1990 | Otsuji et al. | 371/22.36 |
| 5,032,789 | 7/1991 | Firooz et al. | 324/73.1 |
| 5,579,826 | 12/1996 | Hamilton et al. . | |
| 5,737,512 | 4/1998 | Proudfoot et al. | 371/27.1 |

Primary Examiner—Albert W. Paladini
Attorney, Agent, or Firm—Westman, Champlin & Kelly, P.A.

[57] ABSTRACT

A batch test or burn-in board system has a driver/receiver board having a plurality of driver/receiver circuits that are used for burning in individual circuits on a second board in a desired environment. The driver/receiver board sends timed pulses to each of the circuits on the second board. Calibration values for insuring appropriate timing of the pulses from the driver/receiver circuits are stored in a memory that is mounted directly on the driver/receiver board. The calibration values are retrieved from memory under computer control for operating the driver/receiver board for the batch test or burn-in sequence.

6 Claims, 2 Drawing Sheets

DRIVER BOARD HAVING STORED CALIBRATION DATA

BACKGROUND OF THE INVENTION

The present invention relates to a driver/receiver board used for batch testing or burn-in of electronic components on tester burn-in boards (called test boards) that includes a nonvolatile memory for storing calibration data for each of the outputs of the driver/receiver board to eliminate the need for separate calibration each time the driver/receiver board is used.

Batch tester burn-in board systems are used for testing circuit packaging, primarily for digital devices, such as various integrated circuits. The batch test or burn-in systems generally will have a driver/receiver board which will couple to a board mounting the circuits or components to be tested, and will provide a sequence of test signals to each of the circuits. It is important in the test that each of the output signals from the driver/receiver board to each of the circuits or components being tested on the burn-in board is initiated at a precise time, and while this can be calibrated in control computers, calibration each time the driver/receiver board is used slows the test process.

A typical batch test or burn-in board system is shown in U.S. Pat. No. 4,900,948. It includes an environmental chamber, a computer control, and connectors for connecting driver/receiver boards to the burn-in boards on which the circuits or components to be tested are mounted.

Batch testing of components on a separate board involves testing each component, as with burn-in systems. However, the test is shorter and the temperature is about 70° C. instead of 125° C. for burn-in boards. The present invention works with either batch testing or burn-in test systems.

It is desirable to increase the speed with which tests are performed in order to reduce the overall time needed and the costs involved. One way of increasing the speed of a test is to have the calibration time substantially reduced so that a greater percentage of the time involved in an overall test is in the actual testing of the circuits or components on the burn-in board.

SUMMARY OF THE INVENTION

The present invention relates to providing a nonvolatile memory on a driver/receiver board for a batch test or burn-in board system with sufficient capacity to provide compensating calibration signals for each of the individual circuits on the driver/receiver board.

Batch test or burn-in board systems include driver/receiver boards that are programmed through an operating computer to provide signals comprising pulses from a plurality of individual sources to circuits or components on a coupled board (called a component test board). The individual sources on the driver/receiver boards do not perform the same because there are part-to-part variations among the integrated circuits used, as well as manufacturing tolerances for the integrated circuits used on the driver/receiver boards. Incorrect timing of initiation pulses from the plurality of driver circuits to the plurality of circuits on the burn-in board can create unacceptable errors in results. Corrections need to be provided to the driver/receiver board circuits so that there is no skew between the timing of the output pulses between the individual circuits. In some driver/receiver boards there are up to 256 individual circuits sending pulses to a component test board, and calibrating each circuit at the start of a new test takes substantial time.

Using the memory right on the driver/receiver board, the circuits on the driver/receiver board are each addressed appropriately, and when the burn-in or other test sequence is started, the control computer will read the calibration data for each driver/receiver board circuit from the memory on the board, and apply the stored data immediately to the control for each one of the driver/receiver board circuits. This takes a fraction of a second as compared to the time needed for calibrating each of the circuits, which can be several seconds, even using computer controls.

Another feature of the present invention is that if one of the driver/receiver boards is sent to a repair station, after the driver/receiver board is repaired it can be recalibrated at the repair station and the new timing (calibration) values stored back into the nonvolatile memory on the driver/receiver board by a computer which controls the calibration circuits at the repair station. The new calibration data thus is available immediately from the memory on the board when the driver/receiver board is again put into use.

In many test systems, there are several of the individual driver/receiver boards used. For example in one system 32 such driver/receiver boards will be used. With the present invention when the system is first turned on, the computer which controls the system reads the timing values from the nonvolatile memory on each driver/receiver board and writes into the register for that board the calibration for each of the circuits to precisely adjust the time when the pulses from the circuits are initiated, to eliminate any skew or offset in timing between the pulses from individual circuits.

DETAILED DESCRIPTION OF THE PREFERRED EMBODIMENTS

Figure 1:
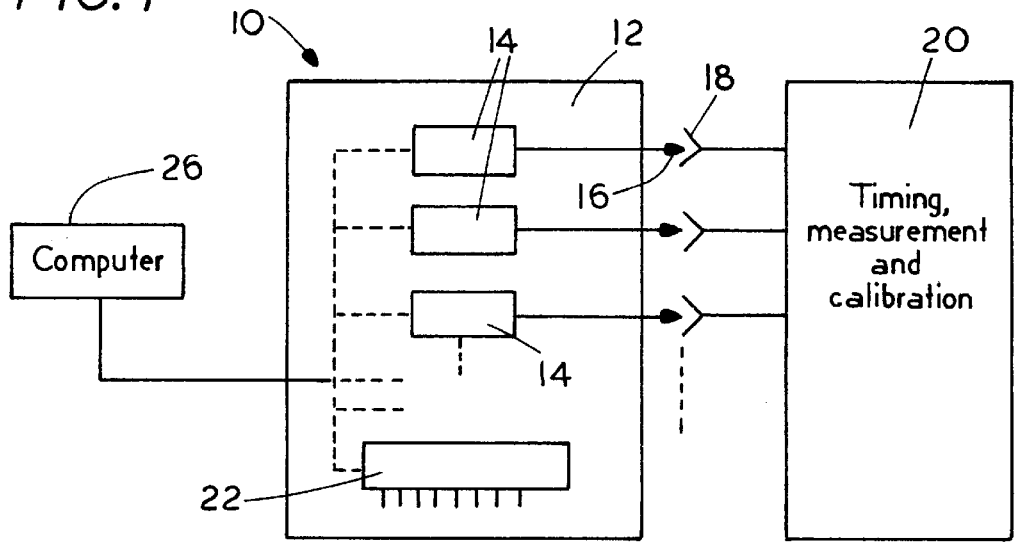
FIG. 1 is a block diagram representation of a typical driver/receiver board for a batch test or burn-in board system being calibrated by using timing measuring circuits and providing correction factors.

FIG. 1 illustrates a calibration system made according to the present invention indicated generally as 10. It includes a driver/receiver board 12 for a typical burn-in system such as that shown in U.S. Pat. No. 4,900,948.

In the present invention, the driver/receiver board 12 has a plurality of driver/receiver circuits 14 that are used for providing test signals, such as timing pulses, to components on a test or burn-in board (component test board). For example, there can be 256 circuits 14 on one of the boards, each with a separate contact or set of contacts shown at 16, that are to be received by sockets 18 for the desired connections to the burn-in board circuits. In FIG. 1, a timing measurement and calibration circuit board 20, which is conventionally used in an initial set-up, or in repair stations, for example, is connected through the sockets 18 to the individual circuits 14. The driver/receiver board 12 has a nonvolatile memory 22 mounted on the board 12. The memory 22 has a sufficient number of addressable locations so that the correction information or data from the timing and calibration circuit board 20 for the circuit 14 connected to each of the contacts 16 is stored in memory 22 by a control computer 26.

The computer 26 is connected to the individual circuits 14 on the driver/receiver board and also to the memory 22, controls and reads information from the timing measurement and calibration circuits as well. The computer 26 reads the calibration data from the calibration board 20 and writes it into memory 22 for each circuit 14.

The nonvolatile memory 22 can be EEPROM, EPROM, NVRAM, FLASH or any number of similar memory devices that are addressable, and can store corrective data to be provided to a control computer later.

Figure 2:
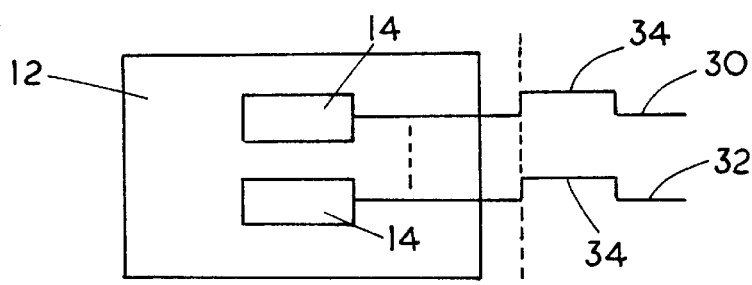
FIG. 2 is a schematic representation of the desired timing between pulses from the first and last circuits and connectors on a driver/receiver board.

FIG. 2 shows a driver/receiver board 12, with two outputs from connectors 16 along timing lines 30 and 32, representing the first circuit and the last (256th) circuit. Each of the timing lines 30 and 32 is shown to have a pulse 34 thereon, which are provided to the output contacts 16 and used for testing components on a connected component test board. The leading edge of each of these pulses 34 has to be timed alike in order to avoid "skew" in the test signals. The correction or calibration factor is provided from memory 22 to computer 26 and then to the respective circuits 14 to insure that the leading edge of each of the timing pulses 34 on all of the circuits on that board is precisely aligned with the others.

Figure 3:
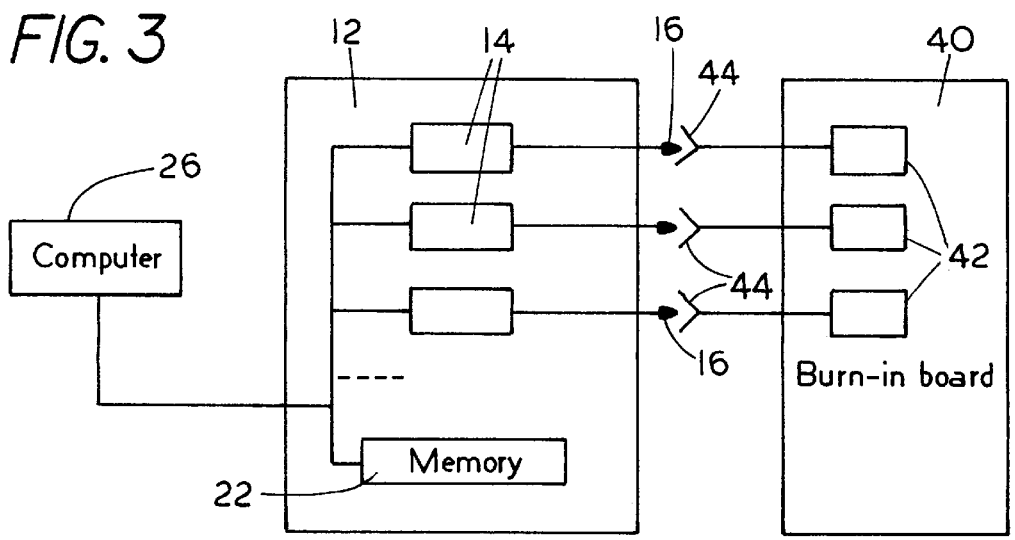
FIG. 3 is a schematic representation of a driver/receiver board having a nonvolatile memory for correcting timing errors according to the present invention coupled to a component test board for testing electronic components.

FIG. 3 illustrates a typical set up for batch testing or burn-in of circuits and components on a component test board assembly, using the driver/receiver board 12 including the nonvolatile memory 22 that retains the timing or other calibration data for each of the driver/receiver circuits. The computer 26 is operating under a program control, and upon initial start up will check the memory 22 for the timing calibration values or other calibration data for each of the circuits 14 on the driver/receiver board 12 and provide the correction factors to each of the outputs.

After the computer has read from memory 22 and added to its controls the corrections for the driver circuits, the timing pulses on each of the contacts 16 will be precisely aligned and there will be no skew as the test require proceeds. As shown schematically in FIG. 3, a burn-in board 40 having components or integrated circuits 42 that are to be tested, is mounted in a housing (not shown) and has sockets 44 that connect to the contacts or connectors 16 to carry the pulse signals as modified by the calibration data to the individual circuits 42 on the burn-in board. In this way, the component test board test is precise because the timing signals from the driver/receiver circuits on the driver/receiver board will be precisely aligned through the use of a corrective or calibration value stored in the memory 22 right on each one of the driver/receiver boards 12.

The data from the memory 22 for each of the circuits 14 is dumped to the computer very rapidly, and there is no need for having a separate calibration each time the driver/receiver board 12 is put into service or used with another burn-in board.

Also, in repair of driver/receiver boards, if one of the circuits 14 becomes defective or faulty, repair can be made and then at the same time the circuits again calibrated with new calibration values stored in the memory 22. The board 12 will be ready to be placed into service without further calibration.

Figure 4:
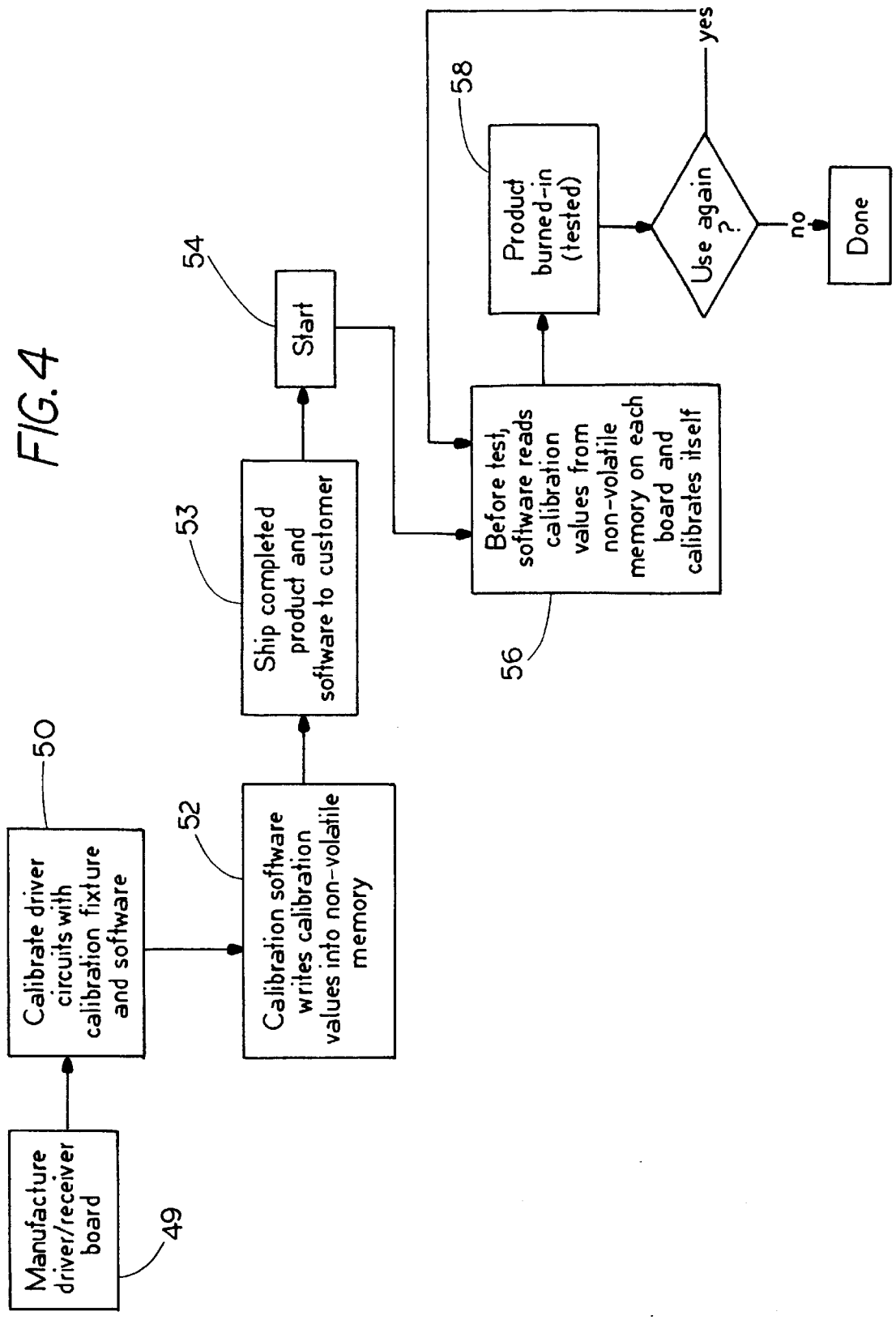
FIG. 4 is a schematic flow diagram of the operation of the present invention.

In FIG. 4, on the flow diagram, the steps include manufacturing the driver/receiver board with the number of separate driver circuits desired as shown at 49. Then calibrating each circuit on the board as indicated by the block 50, under software control using a known calibration fixture, after which the software writes the calibration values into addresses of a nonvolatile memory 22 on the board being calibrated as indicated by the block 52. The calibration data for that particular board is then safely stored right on the board and is carried with the board.

The start signal from the computer represented at 54 will cause the software in the computer to read each calibration value from the memory 22 mounted right on the board and calibrate the software accordingly as indicated at 56. The compensated outputs will be provided using the compensation values to the output connectors for burn-in of the product indicated at block 58.

The test can be completed or performed again for verification as indicated. Having a nonvolatile memory mounted directly on the driver/receiver board with sufficient capacity to store all of the calibration values for all of the contacts on the board for driving or providing test signals, insures that these calibration values will always be properly associated with the control of the driver circuits on that board because they are carried right on the board. The values can be retrieved very readily without separately calibrating each of the driver circuits each time there is a use.

Although the present invention has been described with reference to preferred embodiments, workers skilled in the art will recognize that changes may be made in form and detail without departing from the spirit and scope of the invention.

What is claimed is:

1. A circuit board having a plurality of output circuits for connection to components for testing, a calibration circuit terminal for connection to each output circuit for calibrating and providing correction data for the respective output circuit at a first location, a computer associated with each of the output circuits, reading the correction data from the calibration circuit for each output circuit and a nonvolatile memory mounted directly on the circuit board, the computer storing the correction data for each such circuit in the memory carried by the circuit board for subsequent retrieval at a remote location from the first location.

2. The device of claim 1, wherein said output circuits provide output pulses and the correction data stored in memory comprises pulse timing correction values.

3. A driver/receiver board for a component test board system having a plurality of circuits for connection to components on a component test board, a nonvolatile memory mounted directly on the driver/receiver board containing calibration values for each of the circuits stored from a remote calibration board and a computer being connected to the memory and the output circuits to selectively retrieve the calibration values from the memory for each of the circuits on the driver/receiver board when the circuits on the driver/receiver boards are used.

4. The method of providing calibration signals to individual ones of a plurality of circuits on a circuit board having a separate external connection from each of the circuits comprising the steps of:

calibrating each circuit on the circuit board at a first location and providing calibration data to a nonvolatile memory mounted on the board;

storing the calibration data in the memory for each of the circuits on the board;

moving the circuit boards to a second location;

controlling the circuits on the board at the second location with a computer and causing the calibration values for each of the circuits to be retrieved from the memory on the board and provided to the circuits on the board prior to causing outputs from the circuits to the external connection.

5. The method of claim 4, wherein the circuit boards are driver/receiver boards for a component test board system and including the further step of connecting the external connections to corresponding connections on the component test board prior to providing outputs from the driver/receiver board.

6. The method of claim 4 including the further step of coupling a component test board having components to be tested to the circuit board, each of the components being connected to a separate one of the outputs on the circuit board.

* * * * *